(12) United States Patent
Garcia et al.

(10) Patent No.: US 6,699,436 B1
(45) Date of Patent: Mar. 2, 2004

(54) APPARATUS FOR MEASURING CONTAMINANT MOBILE IONS IN DIELECTRIC MATERIALS

(75) Inventors: James Garcia, Austin, TX (US); Michael McBride, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 308 days.

(21) Appl. No.: 09/904,005

(22) Filed: Jul. 12, 2001

(51) Int. Cl.[7] .................. G01N 33/48; G01N 27/00; G01N 21/00; G01N 37/00; H01L 21/66
(52) U.S. Cl. .............. 422/68.1; 422/50; 422/82.01; 422/83; 422/88; 422/98; 438/14; 438/466; 436/43; 436/149; 73/1.01; 73/1.02; 73/23.2
(58) Field of Search .................. 422/50, 62, 68.1, 422/82.01, 82.02, 82.03, 83, 88, 98; 438/14, 466, 510, 758; 436/43, 149; 73/1.01, 1.02, 23.2

(56) References Cited

U.S. PATENT DOCUMENTS

| | | | |
|---|---|---|---|
| 5,519,334 A | 5/1996 | Dawson | |
| 5,773,989 A * | 6/1998 | Edelman et al. | 324/765 |
| 5,804,981 A | 9/1998 | Lowell et al. | |
| 5,907,764 A * | 5/1999 | Lowell et al. | 438/17 |
| 5,963,783 A | 10/1999 | Lowell et al. | |
| 5,976,900 A * | 11/1999 | Qiao et al. | 438/14 |
| 6,073,501 A | 6/2000 | Rohner | |
| 6,136,669 A * | 10/2000 | Flitsch et al. | 438/466 |
| 6,569,691 B1 * | 5/2003 | Jastrzebski et al. | 438/14 |

OTHER PUBLICATIONS

Wolf, Stanley Ph.D. and Richard N. Tauber, Ph.D, "Silicon Processing for the VLSI Era", 1986, pp. 220–228, vol. 1: Process Technology, Lattice Press, Sunset Beach, California.

* cited by examiner

Primary Examiner—Jill Warden
Assistant Examiner—Brian Sines
(74) Attorney, Agent, or Firm—Ingrassia, Fisher & Lorenz

(57) ABSTRACT

Methods and apparatus are provided for measuring contaminant mobile ions in a dielectric portion of a semiconductor. The apparatus is comprised of a heat source configured to elevate a temperature of the dielectric portion of the semiconductor and mobilize the contaminant mobile ions. The apparatus is also comprised of a fluid source configured to expose the dielectric portion of the semiconductor to a mobilizing fluid having contaminant ion releasing atoms that assists in mobilizing the contaminant mobile ions. The apparatus further comprises a mobile ion measurement unit configured to perform measurements of the contaminant mobile ions in the dielectric portion of the semiconductor.

35 Claims, 2 Drawing Sheets

APPARATUS FOR MEASURING CONTAMINANT MOBILE IONS IN DIELECTRIC MATERIALS

TECHNICAL FIELD

The present invention generally relates to methods and apparatus for measuring contaminant mobile ions in dielectric materials. More particularly, the present invention relates to methods and apparatus for measuring contaminant mobile ions in a dielectric portion of a semiconductor.

BACKGROUND OF THE INVENTION

Generally, semiconductor devices are formed by patterning substantially coplanar conductive traces or interconnects onto the surfaces of substrates followed by layering of the substrates. The substrates are typically formed of dielectric materials or include portions of dielectric material (e.g., dielectric layers or films). The portions of dielectric material (i.e., dielectric portions) are included on the substrates to electrically separate interconnects of each of the layered substrates and exemplary dielectric materials used for semiconductor devices include, but are not limited to, silicon dioxide (oxide) and silicon nitride.

Due to processing of the substrates and other conditions, the dielectric portions often contain variable levels of electrically charged contaminant mobile ions. Such electrically charged ions within the dielectric portions can reduce reliability of semiconductor devices such as metal oxide semiconductor (MOS) devices. As an example, ionized alkali metal atoms (e.g., $Na^+$ and $K^+$) are mobile in oxide layers, and move through gate oxides of MOS devices under the influence of the electric fields generated between gate electrodes and substrates during MOS operation. Over time, mobile ions in gate oxides can drift toward interfaces between the gate oxides and underlying substrates and the resulting changes in MOS device threshold voltage levels may become significant enough to cause electrical performance degradation in circuits that incorporate the MOS device.

To assist in maintaining low levels of mobile ion contamination, it is desirable to measure the contamination of mobile ions. Capacitance/Voltage (c/v) methods, bias temperature treatment methods and other similar methods are commonly employed to monitor such contamination by inducing drift or mobilization of mobile ions within the dielectric materials and measuring differences in electric potential or voltage caused by the mobile ions. Examples of such methods are discussed in commonly owned U.S. Pat. No. 5,963,783, issued to Lowell et al on Oct. 5, 1999, which is herein fully incorporated by reference. These methods commonly employed to measure contamination can be improved as the differences in electric potential upon which these commonly employed contamination measurements may be based can be at least partially caused by non-contaminant mobilized ions or charges. Additionally, contaminant mobile ions may remain immobilized during contamination measurements such that differences in electric potential are unrepresentative of actual contamination levels.

In view of the foregoing, it is desirable to provide methods and apparatus for measuring contaminant mobile ions in dielectric materials. In addition, it is desirable to provide methods and apparatus for measuring contaminant mobile ions in a dielectric portion of a semiconductor. Furthermore, additional desirable features will become apparent to one of ordinary skill in the art from the drawings, foregoing background of the invention and following detailed description of the drawings, and appended claims.

SUMMARY OF THE INVENTION

In accordance with the present invention, methods and apparatus are provided for measuring contaminant mobile ions in a dielectric portion of a semiconductor. The apparatus comprises a heat source that is configured to elevate a temperature of the dielectric portion of the semiconductor and mobilize the contaminant mobile ions. The apparatus is also comprised of a fluid source that is configured to expose the dielectric portion of the semiconductor to a mobilizing fluid having contaminant ion releasing atoms that further assists in mobilizing the contaminant mobile ions. The apparatus further comprises a mobile ion measurement unit configured to perform measurements of the contaminant mobile ions in the dielectric portion of the semiconductor after the temperature of the dielectric portion of the semiconductor is elevated and the dielectric portion of the semiconductor is exposed to the mobilizing fluid.

BRIEF DESCRIPTION OF THE DRAWINGS

The present invention will hereinafter be described in conjunction with the appended drawing figures, wherein like numerals denote like elements, and.

DETAILED DESCRIPTION OF THE DRAWINGS

The following detailed description of the drawings is merely exemplary in nature and is not intended to limit the invention or the application and uses of the invention. Furthermore, there is no intention to be bound by any theory presented in the preceding background of the invention or this detailed description of the drawings.

Figure 1:
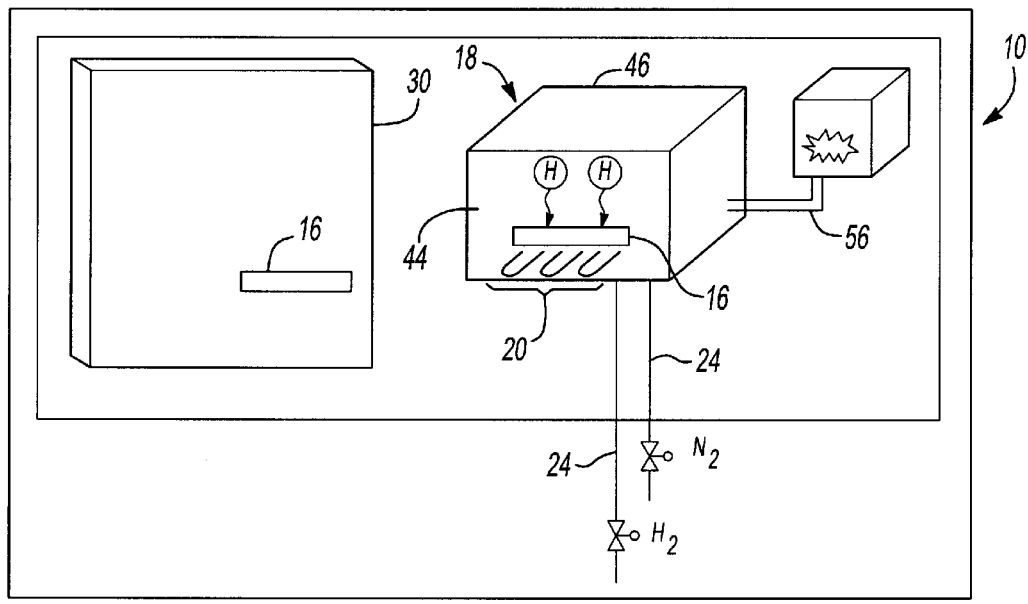
FIG. 1 illustrates an apparatus for measuring contaminant mobile ions in a dielectric portion of a semiconductor according to an exemplary embodiment of the present invention.

Referring to FIG. 1, an apparatus 10 is illustrated that is configured for measuring contaminant mobile ions in a dielectric portion of a semiconductor 16 according to an exemplary embodiment of the present invention. The apparatus 10 is comprised of a mobilization unit 18 having a heat source 20 configured to elevate a temperature (i.e., heat) of at least the dielectric portion of the semiconductor 16 and a fluid source 24 configured to expose at least the dielectric portion of the semiconductor 16 to a mobilizing fluid having contaminant ion releasing atoms that assist in mobilizing the contaminant mobile ions. As used in this detailed description of the drawings, the term "mobilizing" or "mobilize" can mean preparing the contaminant ions for movement or actual movement of the contaminant ions unless specified otherwise herein. The apparatus 10 is further comprised of a mobile ion measurement unit 30 configured to perform measurements of the contaminant mobile ions in the dielectric portion of the semiconductor 16 after the temperature of the dielectric portion of the semiconductor is elevated and the dielectric portion of the semiconductor is exposed to the mobilizing fluid.

Figure 2:
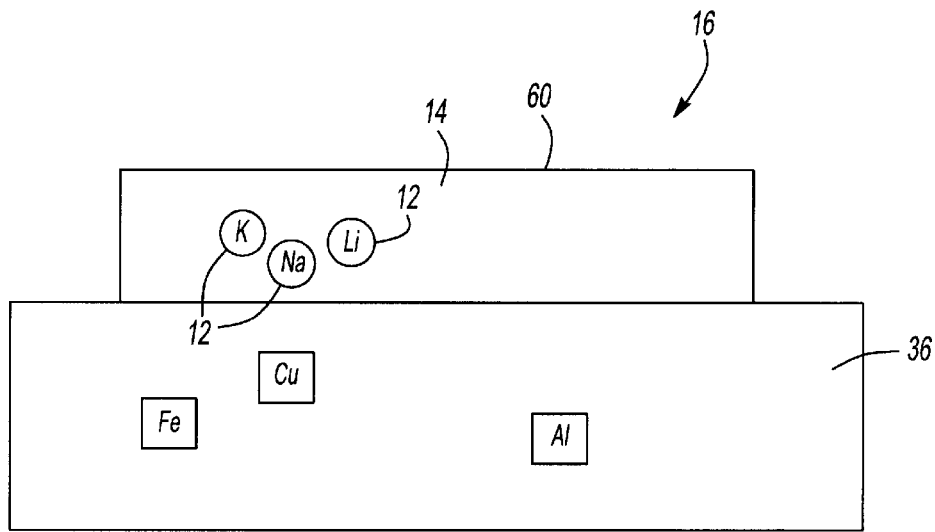
FIG. 2 illustrates an enlarged view of the semiconductor of FIG. 1 with contaminant mobile ions in the dielectric portion of the semiconductor.

Referring to FIG. 2, the apparatus 10 of FIG. 1 can be configured to measure contaminant mobile ions 12 of ionized sodium (Na$^+$), ionized potassium (K$^+$), ionized lithium (Li$^+$) and the like in the dielectric portion 14 of silicon dioxide (SiO$_2$) that is thermally grown on one or more sides of a substrate 36 such as silicon (Si). However, the dielectric portion 14 of the semiconductor 16 can be formed of any dielectric material including, but not limited to, aluminum oxides, silicon nitride, oxynitride composites and the substrate 36 can be any number of materials such as GaAs, GaP, InP, InSb, CdS and CdTe. Additionally, the dielectric portion 14 can substantially cover the entire surface of the substrate 36 or can be formed as a portion (e.g., a layer or film) of the substrate 36 using deposition, dielectric growth or other suitable technique. As used herein, the semiconductor 16 may include any number of configurations and forms, and the term semiconductor is meant to include all semiconductor devices or portions thereof such as semiconductor wafers, substrates and the like, prior to or during any stage of processing.

Referring to FIG. 1, the heat source 20 and the fluid source 24 can be integrated components of the mobilization unit 18 that also includes a chamber 44, which is configured to receive the semiconductor 16 with a support (not shown) such as a quartz boat or other suitable support. Alternatively, the chamber 44 can be configured to receive the semiconductor 16 without a support. According to a preferred exemplary embodiment of the present invention, the mobilization unit 18 includes is a rapid thermal annealing (RTA) unit 46 that forms the chamber 44. However, the mobilization unit 18 can be other configurations and the heat source 20, fluid source 24 and chamber 44 can be separate components that are configured as described in this detailed description of the drawings.

The heat source 20 can be one or more heating elements such as heater rods, heat lamps or the like. However, the heat source 20 can be any heating device that is configured to increase the temperature of at least the dielectric portion of the semiconductor 16. For example, the heat source 20 can be a combustion heater, an electric heater or other suitable heaters. Preferably, the heat source 20 elevates the temperature of at least the dielectric portion to a temperature that is greater than about two hundred degrees Celsius (200° C.) and less than about one thousand degrees Celsius (1000° C.). More preferably, the heat source 20 elevates the temperature of at least the dielectric portion of the semiconductor 16 to a temperature that is greater than about three hundred degrees Celsius (300° C.) and less than about five hundred degrees Celsius (500° C.). Even more preferably, the heat source 20 elevates the temperature of at least the dielectric portion of the semiconductor 16 to about four hundred degrees Celsius (400° C.).

Once the heat source 20 elevates the temperature of at least the dielectric portion of the semiconductor 16, the fluid source 24 preferably exposes at least the dielectric portion of the semiconductor 16 to a mobilizing fluid that assists in mobilizing the mobile contaminant ions. Preferably, the fluid source 24 exposes substantially all of the semiconductor 16 to the mobilizing fluid. Typically, the mobilizing fluid will include contaminant ion releasing atoms for releasing mobile contaminant ions that have been immobilized by charge traps within the dielectric portion of the semiconductor, thereby assisting the heat source 20 in mobilizing the mobile contaminant ions 12. Preferably, the heating and exposure of the dielectric portion to the mobilizing fluid are conducted in a substantially simultaneous manner. However, the heating of the dielectric portion and exposure of the dielectric portion to the mobilizing fluid can be conducted during separate periods of time.

In a preferred embodiment, the fluid source 24 provides the mobilizing fluid to the chamber 44 as a gas that includes about ten percent (10%) hydrogen gas (H$_2$) and about ninety percent (90%) nitrogen gas (N$_2$). It is believed that the hydrogen (H$_2$) gas provides hydrogen ions (H$^+$) for destroying charge traps and/or displacing mobile contaminant ions that are immobilized by the charge traps, thereby assisting in mobilizing the mobile contaminant ions. However, the mobilizing fluid can be comprised of other fluids or combination of fluids that are configured to assist in mobilizing the contaminant ions. For example, as alternatives to nitrogen (N$_2$) gas, hydrogen atoms may be provided with other gasses such as helium, argon or the like. Additionally, it is contemplated that other fluids that contain contaminant ion releasing atoms other than hydrogen may be used to assist in mobilizing contaminant ions. It is further contemplated that the fluid may be provided as a medium other than only a gas such as a gas and liquid combination, only a liquid, a semi-liquid (e.g., a gel) or the like.

The chamber 44 is configured for receiving the mobilizing fluid from the fluid source 24 and preferably configured to maintain a substantial amount of the mobilizing fluid within the chamber 44 such that the dielectric portion is exposed to concentrated contaminant ion releasing atoms. To assist in exposing the dielectric portion to the mobilizing fluid, the mobilization unit 18 can include an exhaust 56 for removing air from the chamber 44 such that the chamber 44 can contain substantially concentrated mobilizing fluid. The exhaust 56 can also be configured for use in burning off excess or used mobilizing fluid as it is purged from the chamber 44. Preferably, the dielectric portion is heated and exposed to the concentrated mobilizing fluid for a predetermined time period from about one (1) minute to about one (1) hour, and more preferably for approximately fifteen (15) minutes, although larger or smaller intervals of time may be used according to the present invention. In addition to mobilizing the mobile contaminant ions, it is believed that the heating in combination with the exposure to the mobilizing fluid may substantially destroy many non-alkali or non-contaminant ions or charges that affect voltages or potentials that may be induced across the dielectric portion during measuring of the contaminant mobile ions.

After mobilization of the mobile contaminant ions in the mobilization unit 18, the semiconductor 16 is typically allowed to cool, preferably to a temperature between zero degrees Celsius (0° C.) and one hundred degrees Celsius (100° C.), and more preferably to about twenty degrees Celsius (20° C). During or after cooling, the semiconductor 16 is transported to an appropriate location within the mobile ion measurement unit 30 to perform at least one measurement of the contaminant mobile ions. The semiconductor 16 can be transported to and/or from the mobile ion measurement unit 30 with any number of transport mechanisms such as a robotic arm (not shown).

Referring to FIG. 2 and according to a preferred embodiment of the invention, the mobile ion measurement unit 30 of FIG. 1 is a corona oxide semiconductor (COS) mobile ion measurement unit that measures potential across a portion 60 (e.g., an exposed or outer surface) of the dielectric portion 14. According to a most preferred embodiment, the COS measurement unit measures three potentials across the surface 60 of the dielectric portion 14, at least two of which are used to determine contaminant mobile ion charge ($Q_m$). More specifically, the mobile ion measurement unit measures a first potential across the surface 60 of dielectric portion 14 upon transport of the semiconductor 16 to the measurement unit and prior to further treatment of the dielectric portion 14.

After the first potential is measured in accordance with the present invention, the mobile ion measurement unit 30 produces a corona charge or "virtual gate", which may be positive or negative, upon the surface 60 of the dielectric portion 14. The mobile ion measurement unit produces the corona charge on the surface 60 of the dielectric portion 14 by ionizing air or other gas molecules and depositing the molecules on the dielectric portion 14 with a corona gun (not shown) or other charge deposition device. The deposit of the corona charge on the surface 60 is preferably repeated with one deposit of a positive charge and a second deposit as a negative charge.

After each of the two corona charge deposits, the semiconductor 16 is transferred to the mobilization unit 18, which has preferably been purged of mobilizing fluid. The heat source 20 of the mobilization unit 18 elevates the temperature of (i.e., heats) the dielectric portion 14, preferably to a temperature greater than about one hundred and forty degrees Celsius (140° C.) and less than about two hundred and forty degrees Celsius (240° C.) in order to assist in mobilizing the contaminant ions 12. In this preferred embodiment, the mobilization unit 18 and the contaminant ion measurement unit 30 are integrated together or are located in close proximity. However, other configurations and arrangements can be utilized in accordance with the present invention. For example, a method performed with separate units is more fully described in commonly owned copending application also titled "Methods and Apparatus for Measuring Contaminant Mobile Ions in Dielectric Materials," which is hereby fully incorporated by reference.

Referring to FIG. 2, as the contaminant ions 12 are mobilized with the elevation of temperature and exposure to the mobilizing fluid, the corona charge moves or biases the contaminant ions 12 either toward or away from the surface 60 of the dielectric portion 14 depending upon whether the corona charge is positive or negative. Typically, the contaminant ions 12 are positive such that the contaminant ions 12 are biased away from the corona charge and away from the surface 60 of the dielectric portion 14 when the corona charge is positive. In addition, the contaminant ions 12 are generally biased toward the corona charge and toward the surface 60 of the dielectric portion 14 when the corona charge is negative.

As previously discussed in this detailed description of the drawings, the temperature of at least the dielectric portion 14 is preferably reduced after the biasing of the contaminant ions 12. Once the temperature of at least the dielectric portion 14 is reduced, a potential across the surface 60 of the dielectric portion 14 is measured after the contaminant ions 12 are biased away from the surface 60 and a potential across the surface 60 of the dielectric portion 14 is measured after the contaminant ions 12 are biased toward the surface 60. A difference between the potential measured with the contaminant ions 12 biased away from the surface 60 and the potential measured with the contaminant ions 12 biased toward the surface is determined, which is the contaminant mobile charge ($Q_m$).

It is preferable that the mobile ion contamination of the dielectric portion 14 is measured after formation or deposition of the dielectric portion 14 on the substrate 36, but prior to further processing of the substrate 36. More preferably, mobile ion contamination is measured after oxidation of the substrate 36 to grow or otherwise form the dielectric portion 14 on the substrate 36. Alternatively, however, the mobile ion contamination may be measured at any semiconductor processing stage.

It may be desirable to perform other measurements. For example, it may be desirable to perform charge/voltage (c/v) measurements (Q–V), effective charge ($Q_{eff}$) measurements, total charge ($Q_{tot}$) measurements, flat band voltage ($V_{fb}$) measurements, interface trap density ($D_{it}$) measurements, generation lifetime ($G_{ife}$) measurements and the like prior to exposing the dielectric portion 14 to heat and/or the mobilizing fluid. It also may be desirable to take a mobile charge ($Q_m$) measurement prior to exposing the dielectric portion 14 to heat and/or the mobilizing fluid such that a comparison can be made between the mobile charge ($Q_m$) prior to such exposure and the mobile charge ($Q_m$) after such exposure as will be subsequently discussed in this detailed description of the drawings. However, it should be understood that the contaminant ion measurements previously described in this detailed description of the drawings are merely exemplary and other contaminant mobile ion measurement units and methods that perform contamination mobile ion measurements may be substituted into and used according to the present invention. For instance, it is contemplated that the mobilization of ions in the mobilizing unit of the present invention can assist in performing mobile ion measurements according to a variety of c/v methods or other appropriate methods. It is also contemplated that mobile ion measurement units, especially those mobile ion measurement units having integrated heating units could be modified to have the mobilizing unit previously described in this detailed description of the drawings for receiving a mobilizing fluid that assists in mobilizing contaminant ions while still maintaining an ability to heat the dielectric portion without exposure to mobilizing fluid. It should be further understood that mobile ion contamination measurements are intended to include a variety of measurements such as voltage measurements, potential measurements or other electrical measurements that are related to mobile ion contamination as well as measurements such as concentration or amount of mobile ion contamination and the like.

Figure 3:
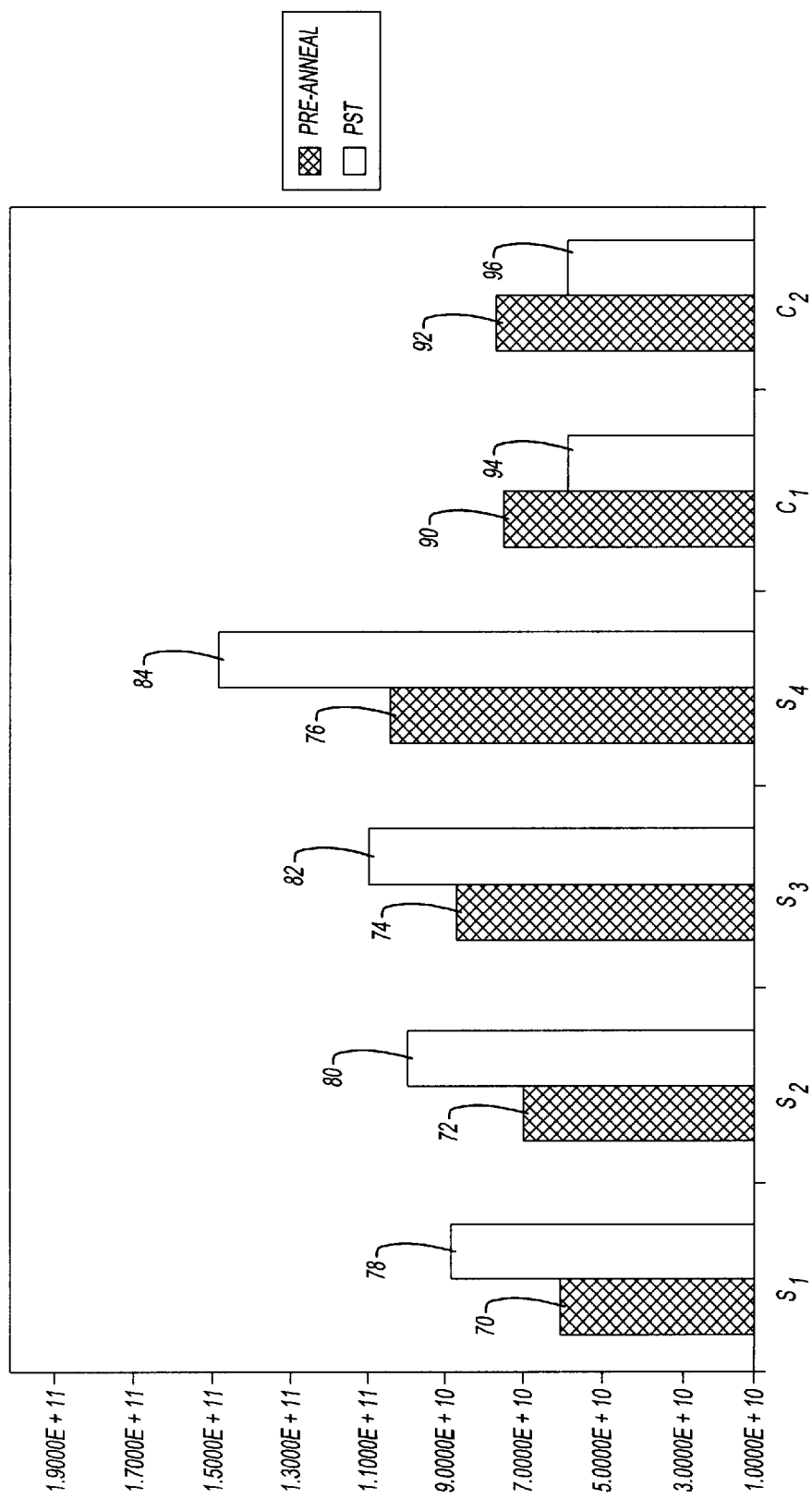
FIG. 3 is a graphical representation of contaminant mobile ion measurements.

Preferably, heating the dielectric portion 14 and exposing the dielectric portion 14 to a mobilizing fluid, which shall also be referred to herein as an annealing of the dielectric portion, assists in releasing contaminant ions, thereby improving the accuracy of the contaminant mobile ion measurements. For example, mobile charge ($Q_m$) measurements (70, 72, 74, 76) for several silicon dioxide test samples ($s_1$, $s_2$, $s_3$, $s_4$) performed before annealing, mobile charge ($Q_m$) measurements (78, 80, 82, 84) of the several silicon dioxide test samples ($s_1$, $s_2$, $s_3$, $s_4$) after annealing, mobile charge ($Q_m$) measurements (90,92) of silicon dioxide control samples ($C_1$,$C_2$) performed before annealing and mobile charge ($Q_m$) measurements (94,96) of silicon dioxide control samples ($C_1$,$C_2$) performed after annealing are illustrated in FIG. 3. With continuing reference to FIG. 3, the silicon dioxide test samples ($s_1$, $s_2$, $s_3$, $s_4$) were contaminated with variable levels of lithium ($Li^+$) mobile ion contamination. The control samples ($C_1$, $C_2$) were processed in a manner that was substantially similar to the silicon dioxide test samples ($s_1$, $s_2$, $s_3$, $s_4$), but were not contaminated with variable levels of lithium ($Li^+$) mobile ion contamination, thereby providing that the ion contamination levels for the control samples ($C_1$, $C_2$) were lower than the test samples ($s_1$, $s_2$, $s_3$, $s_4$). As can be seen in FIG. 3, the annealing caused the mobile charge measurements for the test samples ($s_1$, $s_2$, $s_3$, $s_4$) to increase while causing the mobile charge measurements for the control samples ($C_1$, $C_2$) to decrease. Thus, it is can be appreciated by one of ordinary skill in the art that the annealing assists in providing increased accuracy for detection of contaminant mobile ions and may also assist in minimizing false readings of charges that are not provided by contaminant mobile ions.

It may be desirable to have a method for measuring mobile ion contamination that includes performing mobile ion contamination measurements before and after exposure to a mobilizing fluid. More specifically and with reference to FIG. 2, it may be desirable to perform a first mobile ion charge ($Q_m$) measurement prior to exposure to heat in the presence of mobilizing fluid and a second mobile ion measurement charge ($Q_m$) measurement after such exposure. Depending on whether the second measurement is greater than or less than the first measurement, additional determinations regarding the actual amounts of mobile ion contamination and the cause of fluctuations in the values of the measurements may be made in accordance with the present invention. For example, mobile charge ($Q_m$) measurements that are increasing after exposure of the dielectric portion 14 to heat and mobilizing fluid may indicate that an excessive amount of charge traps are present in the dielectric portion 14 and measures may be taken to reduce such traps. As another example, mobile charge ($Q_m$) measurements that are decreasing may indicate that an excessive amount of non-contaminant mobile ions are present in the dielectric portion 14 and measures may be taken to reduce such non-contaminant ions.

From the foregoing, it should be appreciated that methods and apparatus are provided for measuring mobile contaminant ions. In addition, is should be appreciated that methods and apparatus are provided for measuring contaminant mobile ions in a dielectric portion of a semiconductor. While a preferred exemplary embodiment has been presented in the foregoing detailed description of the drawings, it should be understood that a vast number of variations exist and this preferred exemplary embodiment is merely an example, and it is not intended to limit the scope, applicability or configuration of the invention in any way. Rather, the foregoing detailed description provides those of ordinary skill in the art with a convenient road map for implementing a preferred embodiment of the invention and various changes can be made in the function and arrangements of the exemplary embodiment without departing from the spirit and scope of the appended claims.

What is claimed is:

1. An apparatus for measuring contaminant mobile ions in a dielectric portion of a semiconductor, comprising:
    a mobilization unit for assisting in mobilizing the contaminant mobile ions, the mobilization unit comprising:
    a heat source configured to elevate a temperature of the dielectric portion of the semiconductor; and
    a fluid source configured to expose the dielectric portion of the semiconductor to a mobilizing fluid having contaminant ion releasing atoms that assist in mobilizing the contaminant mobile ions; and
    a mobile ion measurement unit configured to perform measurements of the contaminant mobile ions in the dielectric portion of the semiconductor, the mobile ion measurement unit integral with the mobilization unit.

2. The apparatus for measuring contaminant mobile ions in a dielectric portion of a semiconductor of claim 1, wherein the mobilizing fluid is a gas.

3. The apparatus for measuring contaminant mobile ions in a dielectric portion of a semiconductor or claim 1, wherein the mobilizing fluid is comprised of hydrogen gas.

4. The apparatus for measuring contaminant mobile ions in a dielectric portion of a semiconductor of claim 3, wherein the mobilizing fluid is further comprised of nitrogen gas.

5. The apparatus for measuring contaminant mobile ions in a dielectric portion of a semiconductor of claim 4, wherein the mobilizing fluid is comprised of approximately ten percent (10%) of hydrogen gas and approximately ninety percent (90%) of nitrogen gas.

6. The apparatus for measuring contaminant mobile ions in a dielectric portion of a semiconductor of claim 3, wherein the mobilizing fluid is further comprised of helium gas.

7. The apparatus for measuring contaminant mobile ions in a dielectric portion of a semiconductor of claim 1, wherein the heat source and the fluid source are integrated into a mobilization unit having a chamber for receiving the semiconductor.

8. The apparatus for measuring contaminant mobile ions in a dielectric portion of a semiconductor of claim 7, wherein the mobilization unit is a Rapid Thermal Annealing (RTA) unit.

9. The apparatus for measuring contaminant mobile ions in a dielectric portion of a semiconductor apparatus of claim 6, wherein the RTA unit is integrated into the mobile ion measurement unit such that the RTA unit can function to elevate the temperature of the dielectric portion of the semiconductor while exposing the dielectric portion to the mobilization fluid and function to elevate the temperature of the dielectric portion without exposing the dielectric portion to the mobilizing fluid, thereby allowing the mobile ion measurement unit to perform measurements of the contaminant mobile ions in the dielectric portion of the semiconductor.

10. The apparatus for measuring contaminant mobile ions in a dielectric portion of a semiconductor of claim 1, wherein the mobile ion measurement unit measure the mobile contaminant ions at least partly by biasing the mobile contaminant ions within the dielectric portion of the semiconductor.

11. The apparatus for measuring contaminant mobile ions in a dielectric portion of a semiconductor of claim 1, wherein the mobile ion measurement unit measures the mobile contaminant ions by inducing one or more electric potentials across the dielectric portion of the semiconductor.

12. The apparatus for measuring contaminant mobile ions in a dielectric portion of a semiconductor of claim 1, wherein the temperature is greater than about two hundred degrees Celsius (200° C.) and less than about one thousand degrees Celsius (1000° C.).

13. The apparatus for measuring contaminant mobile ions in a dielectric portion of a semiconductor of claim 1, wherein the temperature is greater than about three hundred degrees Celsius (300° C.) and less than about five hundred degrees Celsius (500° C.).

14. The apparatus for measuring contaminant mobile ions in a dielectric portion of a semiconductor of claim 1, wherein the temperature is greater than about four hundred degrees Celsius (400° C.).

15. The apparatus for measuring contaminant mobile ions in a dielectric portion of a semiconductor of claim 1, wherein the mobilizing fluid is comprised of contaminant ion releasing atoms for releasing the contaminant mobile ions immobilized by charge traps within the dielectric portion of the semiconductor.

16. The apparatus for measuring contaminant mobile ion in a dielectric portion of a semiconductor of claim 1, wherein the semiconductor is a silicon semiconductor wafer and the dielectric portion is at least partially silicon dioxide.

17. An apparatus for measuring contaminant mobile ions in a dielectric portion of a semiconductor, comprising:
    a heat source that is configured to elevate a temperature of the dielectric portion of the semiconductor;

a fluid source that is configured to expose the dielectric portion of the semiconductor to A mobilizing fluid having contaminant ion releasing atoms that assist in mobilizing the contaminant mobile ions; and a COS mobile ion measurement unit that is configured to perform measurements of the contaminant mobile ions in the dielectric portion of the semiconductor after the temperature of the dielectric portion of the semiconductor is clevated and the dielectric portion of the semiconductor is exposed to the mobilizing fluid.

18. The apparatus for measuring contaminant mobile ions in a dielectric portion of a semiconductor of claim 17, wherein the mobilizing fluid is comprised of approximately ten percent (10%) of hydrogen gas and approximately ninety percent (90%) of nitrogen gas.

19. The apparatus for measuring contaminant mobile ions in a dielectric portion of a semiconductor of claim 17, wherein the mobilization unit is a rapid thermal annealing (RTA) unit.

20. The apparatus for measuring contaminant mobile ions in a dielectric portion of a semiconductor of claim 19, wherein the RTA unit can additionally function to elevate the temperature of the dielectric portion without exposing the dielectric portion to the mobilizing fluid, thereby allowing the mobile ion measurement unit to perform measurements of the contaminant mobile ions in the dielectric portion of the semicondutor.

21. The apparatus for measuring contaminant mobile ions in a dielectric portion of a semiconductor of claim 17, wherein the mobile ion measurement unit measures the mobile contaminant ions by inducing one or more electric potentials across the dielectric portion of the semiconductor.

22. The apparatus for measuring contaminant mobile ions in a dielectric portion of a semiconductor of claim 17, wherein the semiconductor is a silicon semiconductor wafer and the dielectric portion is at least partially silicon dioxide.

23. An apparatus for measuring contaminant mobile ions in a dialectic portion of a semiconductor, comprising:

a rapid thermal annealing unit for assisting in mobilizing the contaminant mobile ions, the rapid thermal annealing unit including a source of hydrogen gas and nitrogen gas for exposing the dielectric portion to concentrated hydrogen and nitrogen gas, the rapid thermal annealing unit further including a beat source for heating the dielectric portion; and a COS mobile ion measurement unit integrated with the rapid thermal annealing unit, the measurement unit configured to perform measurements of the contaminant mobile ions in the dielectric portion of the semiconductor.

24. The apparatus for measuring contaminant mobile ions in a dielectric portion of a semiconductor of claim 17, wherein the source provides approximately ten percent (10%) of hydrogen gas and approximately ninety percent (90%) of nitrogen gas.

25. An apparatus for measuring contaminant mobile ions in a dielectric portion of a semiconductor, the apparatus comprising:

mobilization means for assisting in mobilizing the contaminant mobile ions, comprising:

an heating means for elevating a temperature of the dielectric portion of the semiconductor; and a exposure means for exposing the dielectric portion of the semiconductor to a mobilizing fluid having contaminant ion releasing atoms that assist in mobilizing the contaminant mobile ions; and a measuring means for measuring the contaminant mobile ions in the dielectric portion of the semiconductor.

26. The apparatus for measuring contaminant mobile ions in a dielectric portion of a semiconductor of claim 25, wherein the measurement means is integral with the mobilization means.

27. The apparatus for measuring contaminant mobile ions in a dielectric portion of a semiconductor of claim 25, wherein the mobilizing fluid is a gas.

28. The apparatus for measuring contaminant mobile ions in a dielectric portion of a semiconductor of claim 27, wherein the mobilizing fluid is comprised of hydrogen gas.

29. The apparatus for measuring contaminant mobile ions in a dielectric portion of a semiconductor of claim 28, wherein the mobilizing fluid is comprised of approximately ten percent (10%) of hydrogen gas and approximately ninety percent (90%) of nitrogen gas.

30. The apparatus for measuring contaminant mobile ions in a dielectric portion of a semiconductor of claim 25, wherein the heating means and the exposure means are integrated into the mobilization means having a chamber for receiving the semiconductor.

31. The apparatus for measuring contaminant mobile ions in a dielectric portion of a semiconductor of claim 25, wherein the mobilization means is integrated with the measuring means such that the mobilization means can function to elevate the temperature of the dielectric portion of the semiconductor while exposing the dielectric portion to the mobilization fluid and can function to elevate the temperature of the dielectric portion without exposing the dielectric portion to the mobilizing fluid, thereby allowing the measuring means to perform measurements of the contaminant mobile ions in the dielectric portion of the semiconductor.

32. The apparatus for measuring contaminant mobile ions in a dielectric portion of a semiconductor of claim 25, wherein the measuring means measures the mobile contaminant ions at least partly by biassing the mobile contaminant ions within the dielectric portion of the semiconductor.

33. The apparatus for measuring contaminant mobile ions in a dielectric portion of a semiconductor of claim 25, wherein the measuring mans measures the mobile contaminant ions by inducing at least one electric potential across the dielectric portion of the semiconductor.

34. The apparatus for measuring contaminant mobile ions in a dielectric portion of a semiconductor of claim 25, wherein the temperature is greater than about two hundred degrees Celsius (200° C.) and less than about one thousand degrees Celsius (1000° C.).

35. The apparatus for measuring contaminant mobile ions in a dielectric portion of a semiconductor of claim 34, wherein the temperature is greater than about three hundred degrees Celsius (300° C.) and less than about five hundred degrees Celsius (500° C.).

* * * * *

UNITED STATES PATENT AND TRADEMARK OFFICE
CERTIFICATE OF CORRECTION

PATENT NO. : 6,699,436 B1
DATED : March 2, 2004
INVENTOR(S) : James Garcia et al.

It is certified that error appears in the above-identified patent and that said Letters Patent is hereby corrected as shown below:

Column 7,
Line 60, delete "or" and insert -- of --;

Column 8,
Line 36, delete "1" and insert -- 10 --;
Line 60, delete "ion" and insert -- ions --;

Column 9,
Line 2, delete "A" and insert -- a --;
Line 44, delete "beat" and insert -- heat --.

Signed and Sealed this

Eighteenth Day of May, 2004

JON W. DUDAS
*Acting Director of the United States Patent and Trademark Office*